United States Patent
Ariyoshi

(10) Patent No.: US 7,168,030 B2
(45) Date of Patent: Jan. 23, 2007

(54) TURBO CODE DECODER WITH PARITY INFORMATION UPDATE

(75) Inventor: Masayuki Ariyoshi, Tokyo (JP)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 502 days.

(21) Appl. No.: 10/686,774

(22) Filed: Oct. 17, 2003

(65) Prior Publication Data

US 2005/0086570 A1 Apr. 21, 2005

(51) Int. Cl.
*H03M 13/03* (2006.01)
(52) U.S. Cl. .................... 714/786; 714/755
(58) Field of Classification Search ........... 714/755, 714/786
See application file for complete search history.

(56) References Cited

U.S. PATENT DOCUMENTS 6,266,795 B1 7/2001 Wei

FOREIGN PATENT DOCUMENTS

EP 1 432 129 A2 6/2004

OTHER PUBLICATIONS

Ariyoshi et al, "Iterative Decoding Algorithms Updating Likehood and Channel Values Bsed on Interim Hard Decision Results", ISIT 2000, Sorrento, Italy. Jun. 25-30, 2000, pp. 174.
Patent Abstracts of Japan, vol. 200, No. 022, Mar. 9, 2001 & JP 19990301519 (Keio Gijuku), May 11, 2001.
International Search Report mailed Feb. 2, 2005 in corresponding PCT application No. PCT/SE2004/001439.
Berrou et al, "Near Optimum Error Correcting Coding and Decoding: Turbo-Codes", IEEE Transactions on Communications, vol. 44, No. 10, Oct. 1996, pp. 1261-1271.
Valenti, "An Efficient Software Ratio Implementation of the UMTS Turbo Codec".
Valenti, "An Introduction to Turbo Codes".

*Primary Examiner*—Guy J. Lamarre
(74) *Attorney, Agent, or Firm*—Nixon & Vanderhye, P.C.

(57) ABSTRACT

In a turbo code decoder (100, 100B), likelihood information for redundant parts of a received symbol sequence are used to update the redundant parts of the received symbol sequence for use by the decoder (100, 100B). The redundant likelihood update unit (101) comprises a first compare and update unit (204$_1$) and a second compare and update unit (204$_2$). The respective compare and update units (204) compare the likelihood information for their respective redundant part of the received symbol sequence with the original respective redundant part of the received symbol sequence, and obtain updated likelihood information for their respective redundant parts of the received symbol sequence.

28 Claims, 8 Drawing Sheets

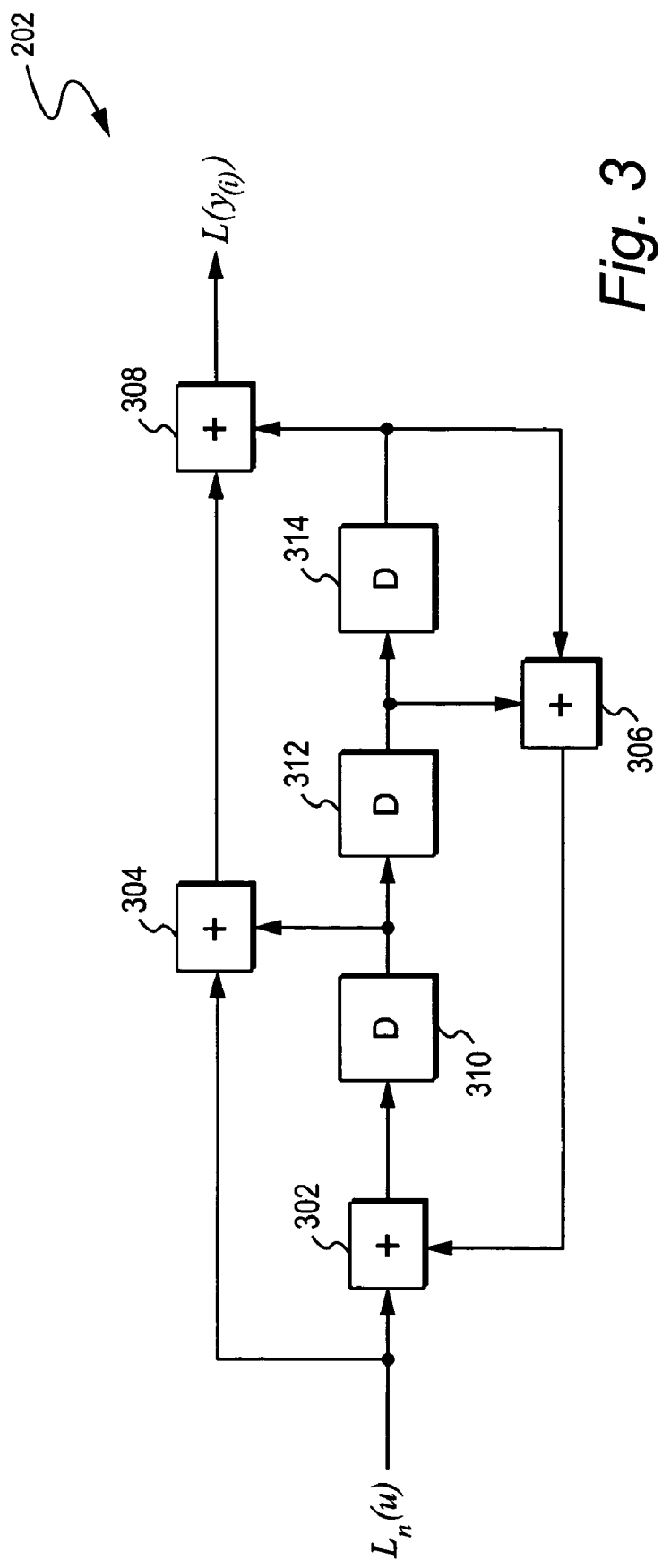

TURBO CODE DECODER WITH PARITY INFORMATION UPDATE

BACKGROUND

1. Field of the Invention

The present invention pertains to information theory, and particularly to a class of binary parallel concatenated recursive systematic convolutional codes known as turbo codes, as well as apparatus and method using turbo codes.

2. Related Art and Other Considerations

Data transmitted over a channel data may be corrupted from its original form. One example is data transmitted over a wireless, e.g., radio frequency, interface between a transmitter and receiver (one of which may be a mobile or cellular telephone, for example). Various encoding techniques have been employed so that errors in a string of received data bits may be located and, if possible, corrected. Such error correction techniques typically employ utilization of error correction code(s) which operate upon the original data in order to generate additional information which is transmitted along with the original data. Inclusion of the additional information with the received data facilitates the location and possible correction of error bits by the receiver, so that the receiver may ultimately obtain the original data as transmitted by the transmitter.

Many types of codes have been utilized in the error correction branch of information theory. Turbo codes, introduced in 1993, are considered to have high error correction capability and good performance. See, e.g., C. Berrout, A. Glavieux, and P. Thitimajshima, "Near Shannon Limit Error Correcting Coding and Decoding: Turbo Codes", Proc. ICC93, pp. 1064–1070, May 1993, and C. Berrout and A. Glavieux, "Near Optimum Error Correcting Coding and Decoding: Turbo Codes", *IEEE Trans. On Communications*, Vol. 44, No. 10, pp. 1261–1271, October. 1996.

The basic structure of turbo codes is the parallel concatenation of two or more component codes applied to different interleaved versions of the same information sequence. Recursive systematic convolutional (RSC) codes are used in general as the component codes. The constraint length K for the RSC codes could be shorter than that of conventional convolutional codes to achieve the equivalent or better performance.

FIG. 10 illustrates the structure of an example turbo code encoder. The example encoder 1000 of FIG. 10 comprises two RSC encoders $1002_1$ and $1002_2$ concatenated in parallel. In view of there being two encoders (e.g., M=2), the code rate of the illustrative turbo code encoder has a code rate R=⅓, since (as an approximation) R=1/(M+1)). The input to the first RSC encoder $1002_1$ is the original information sequence d. The original information sequence is also applied to an interleaver 1004 to produce an interleaved version d' of the original information sequence d. The interleaved version d' of the information sequence is the input to the second RSC encoder $1002_2$. Since the RSC is the systematic encoder, the outputs from the turbo encoder are sequences of systematic u (=d) and redundant parts $x_{(1)}$ (output from the first RSC encoder $1002_1$) and $x_{(2)}$ (output from the second encoder $1002_2$). In other words, the output of the encoder 1000 is in the form $u_1$, $x_{1(1)}$, $x_{1(2)}$, $u_2$, $x_{2(1)}$, $x_{2(2)}$, where $u_k$ is the $k^{th}$ systematic bit (i.e., data bit), $x_{k(1)}$ is the parity output from the first RSC encoder $1002_1$ associated with the $k^{th}$ systematic bit $u_k$; and $x_{k(2)}$ is the parity output from the second RSC encoder $1002_2$ associated with the $k^{th}$ systematic bit $u_k$.

The decoding procedure for the turbo codes is known as iterative decoding. An example conventional turbo decoder, shown as decoder 1100 in FIG. 11, is comprised of two component decoders $1102_1$, and $1102_2$ (corresponding to the RSC encoders $1002_1$ and $1002_2$, respectively); an interleaver 1104 (which is the same type interleaver as interleaver 1004 used in the corresponding turbo encoder); and, a de-interleaver 1106 (which also corresponds to the interleaver 1004). The two component decoders $1102_1$ and $1102_2$ are soft-input and soft-output (SISO) decoders. The outputs of the two component decoders $1102_1$ and $1102_2$ are likelihood information concerning the coded data sequence.

The inputs to the turbo decoder 1100 are the channel measurements made at the detector for the systematic part $y_{(0)}$, the redundant parts $y_{(1)}$ and $Y_{(2)}$. These inputs correspond to u, $x_{(1)}$, and $x_{(2)}$, respectively. The component decoder computes, for the $k^{th}$ decoded bit $d_k$, the probability that this bit was 1 or 0, after the received symbol sequence $\bar{y}=\{y_{(0)}, y_{(1)}, y_{(2)}\}$ is given.

Computing this probability is equivalent to finding the a posteriori log likelihood ratio (LLR) $L(\hat{d})=L(d_k|\bar{y})$, as shown by Expression (1).

$$L(d_k \mid \bar{y}) = \ln\left(\frac{P(d_k = 1 \mid \bar{y})}{P(d_k = 0 \mid \bar{y})}\right) \quad \text{Expression (1)}$$

In Expression 1, $P(d_k=1)$ is the probability that the bit $d_k=1$, and $P(d_k=0)$ is the probability that the bit $d_k=0$. The input LLR for the data bit d to the component decoder, designated $L_{in}$ (d), is expressed by Expression (2).

$$L_{in}(\hat{d}) = y_{(0)} + L(d) \quad \text{Expression (2)}$$

In Expression 2, L(d) is the a priori LLR of the d. For a systematic code, it has been shown (by C. Berrout, A. Glavieux, and P. Thitimajshima, "Near Shannon Limit Error Correcting Coding and Decoding: Turbo Codes", Proc. ICC93, pp. 1064–1070, May 1993) that the LLR equals to $$L(\hat{d}) = L_{in}(\hat{d}) + Le(\hat{d}) \quad \text{Expression (3)}$$
$$= y_{(0)} + L(d) + Le(\hat{d})$$

In Expression (3) $Le(\hat{d})$, called the extrinsic LLR, represents extra knowledge that is gleaned from the decoding process. In the iterative decoding procedure, the extrinsic LLR calculated from the previous component decoder will be set as a priori LLR for the next component decoder. At the very first component decoding, L(d) is set as 0. Since the component decoders 1102 are connected each other together with the interleaver 1104/de-interleaver 1106 as seen in FIG. 11, these operations are repeated. With more decoding iterations, the accuracy of the likelihood of the systematic bits $L(\hat{d})$ becomes better. After a number of iterations, finally the sign of $L(\hat{d})$ will be the decoder decision for the result, and the amplitude of $L(\hat{d})$ denotes the reliability of that decision. Thus, using turbo decoding, the error correcting performance is improved through the iterative procedure.

Further discussions of principles involved in turbo coding and decoding are provided in B. Sklar, "A Primer on Turbo Code Concepts," *IEEE Communications Magazine*, pp. 94–102, December 1997; A. Ushirokawa, T. Okamura, N. Kamiya, and B. Vucetic, "Principles of Turbo Codes and Their Applications to Mobile communications," *IEICE*

*Trans. On Fundamentals*, vol. E81-A, No. 7, July 1998; J. P. Woodard and L. Hanzo, "Comparative Study of Turbo Decoding Techniques: An Overview," *IEEE Trans. On Vehicular Technology*, vol. 49, no. 6, pp. 2208–2233, November 2000.

Characteristics and performance of turbo codes are shown in P. Jung, "Comparison of Turbo-Code Decoders Applied to Short Frame Transmission Systems," *IEEE Journal on Selected Areas on Communications*, vol. 14, no. 3, pp. 530–537, April 1996; P. Jung and M. Baβhen, "Results on Turbo-Codes for Speech Transmission in a Joint Detection CDMA Mobile Radio System with Coherent Receiver Antenna Diversity," *IEE Trans. on Vehicular Technology*, vol. 46, no. 4, November 1997; H. Koorapaty, Y. E. Wang, and K. Balachandran, "Performance of Turbo Codes with Short Frame Sizes", Proc. of 1997; and P. Frenger, "Turbo Decoding for Wireless Systems with Imperfect Channel Estimates," *IEEE Trans. on Communications*, vol. 48, no. 9, September 2000. A turbo code decoding analysis is provided in D. Divsalar, S. Dolinar and F. Pollara, "Iterative Turbo Decoder Analysis Based on Density Evolution," *IEEE Journal on Selected Areas in Communication*, vol. 19, no. 5, May 2001. All the foregoing are incorporated by reference in their entirety.

In any type of decoder (not just turbo decoders), the accuracy of the decoder is heavily dependent upon the reliability of the input for the decoder. What is sought, therefore, and an object of the present invention, is a technique for improving the accuracy of a turbo decoder by improving reliability of its inputs.

BRIEF SUMMARY

In a turbo code decoder, likelihood information for redundant parts of a received symbol sequence is used to update the redundant parts of the received symbol sequence for use by the decoder.

In one example embodiment, the redundant likelihood update unit comprises a soft output recursive systematic convolutional (RSC) encoder which uses the likelihood information for a systematic part of a received symbol sequence to generate likelihood information for a first redundant part of the received symbol sequence and to generate likelihood information for a second redundant part of the received symbol sequence. The soft output recursive systematic convolutional (RSC) encoder handles a posteriori log likelihood ratio (LLR) values.

In another example embodiment, the turbo code decoder comprises a soft output decoder which provides both likelihood information for a systematic part of the received symbol sequence and likelihood information for redundant parts of the received symbol sequence (i.e., likelihood values for a first redundant part of the received symbol sequence and likelihood values for a second redundant part of the received symbol sequence).

In the example embodiments, the redundant likelihood update unit comprises a first compare and update unit and a second compare and update unit. The respective compare and update units compare the likelihood information for their respective redundant part of the received symbol sequence with the original respective redundant part of the received symbol sequence, and obtain updated likelihood information for their respective redundant parts of the received symbol sequence.

In updating a redundant part of the received symbol sequence the redundant likelihood update unit first compares, on a bit by bit basis, a sign of (1) the likelihood information for a redundant part of the received symbol sequence with a sign of (2) a corresponding original redundant part of the received symbol sequence. If the signs for (1) and (2) are the same, an amplitude of the corresponding updated redundant part for the $k^{th}$ symbol of the received symbol sequence becomes an amplitude of a larger of (1) and (2). On the other hand, if the signs for (1) and (2) are different, a sum of (1) and (2) is used as the amplitude for the corresponding updated redundant part for the $k^{th}$ symbol of the received symbol sequence.

The redundant likelihood update units further comprise a timing and control unit which controls when the redundant information should be updated in the iterative decoding process, and which supervises, e.g., the correlation between the re-encoded sequence of the redundant LLR and the source sequence of the systematic LLR. For example, the timing and control unit can determine timing for operation of the redundant likelihood update unit based on a signal-to-noise ratio (SNR) of received signals, or based on interim decoding error counts, or both.

Another aspect of the invention is a wireless radio frequency receiver which has an antenna and a base band signal processor. The base band processor has a demodulator (which provides a demodulated base band signal); an optional de-interleaver (which de-interleaves the demodulated base band signal); an optional rate de-matcher (which adjust the number of demodulated bits being matched with that for the turbo decoder); and a turbo decoder. The turbo decoder comprises a redundant likelihood update unit which uses likelihood information for redundant parts of the received symbol sequence to update the redundant parts of the received symbol sequence for use by the decoder.

One advantage which attends a turbo code decoder with its redundant likelihood update unit (RLU) unit is improvement in bit error rate (BER) or block error rate (BLER) performance. Another advantage is that the achievable BER/BLER can be improved (providing, e.g., reduce decoding computations (iterations) and decoding processing time (delay)).

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 3 is a schematic view of an example soft output RSC encoder for use in the example redundant likelihood update unit of FIG. 2A.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

The general turbo decoding algorithm with its iterative procedure improves the accuracy of likelihood information for the systematic part which is input to the component decoders. Yet in the conventional turbo decoders, as described above, only the likelihood information for the systematic part is updated through the iterations. But there are other inputs to the component decoders—the redundant parts. Now described by non-limiting, representative examples embodiments are turbo decoders having reliability enhanced by utilizing a redundant likelihood technique implemented, e.g., by a redundant likelihood unit (RLU). In these examples, the inputs to the turbo decoder are not only the systematic parts information, but also the redundant parts information which is updated effectively, so that their accuracy and the decoding performance is improved.

Figure 1A:
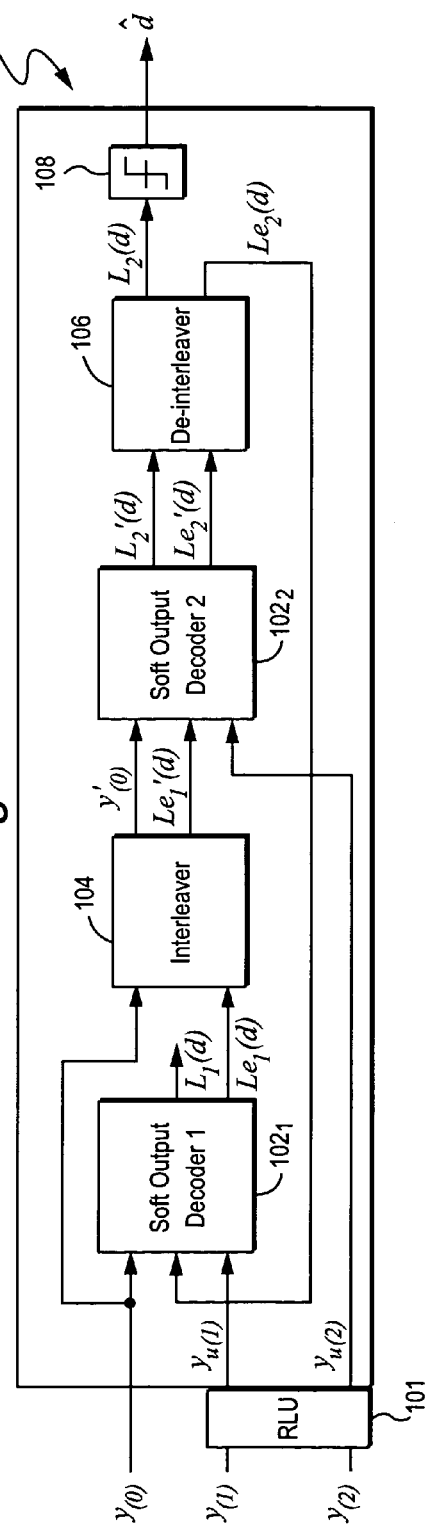
FIG. 1A and FIG. 1B are schematic views of different example embodiments of turbo code decoders.

FIG. 1A is a schematic view of an example embodiment turbo code decoder 100 which utilizes a redundant likelihood update technique. The turbo code decoder 100 includes a redundant likelihood update unit 101 as well as two component decoders $102_1$ and $102_2$; an interleaver 104; and, a de-interleaver 106. The two component decoders $102_1$ and $102_2$ are soft-input and soft-output (SISO) decoders. The component decoders $102_1$ and $102_2$ interleaver 104, and de-interleaver 106 are configured or chosen to correspond to compatible elements in a turbo encoder which generates a coded symbol sequence which is to be decoded by turbo code decoder 100.

From the foregoing it will be appreciated that turbo code decoder 100 is an example of turbo decoder for a code with code rate of ⅓. However, it should be understood that the present invention is not confined or limited to any particular code rate, and that by modification (such as including a greater number of component decoders, etc.) the turbo code decoder 100 can be configured for handling codes of a different code rate. Moreover, the turbo decoder 100 can be used with turbo codes with $R>1/(m+1)$, e.g. for turbo codes with puncturing.

The turbo code decoder 100 of FIG. 1A is fed a received symbol sequence $\bar{y}=\{y_{(0)}, y_{(1)}, y_{(2)}\}$, and thereafter operates in an essentially iterative manner. The systematic part $y_{(0)}$ of the received symbol sequence is applied both to a first input terminal of component decoder $102_1$ and to a first input terminal of interleaver 104. The redundant parts $y_{(1)}, y_{(2)}$ of the received symbol sequence are applied to respective input terminals of RLU unit 101. Corresponding output terminals of RLU unit 101 apply updated redundant parts $y_{u(1)}, y_{u(2)}$ to input terminals of component decoder $102_1$ and component decoder $102_2$, respectively.

The operation of turbo code decoder 100 occurs in an iterative manner. A full iteration comprises two half-iterations. In a first half-iteration the component decoder $102_1$ performs its functionality, while in a second half-iteration the component decoder $102_2$ performs its functionality. For a given received symbol sequence $\bar{y}=\{y_{(0)}, y_{(1)}, y_{(2)}\}$, there may be several full iterations performed by turbo code decoder 100. After one or more iterations have been performed, operation of the RLU unit 101 is invoked between further iterations until such time as RLU unit 101 is no longer needed. Prior to invocation of the RLU unit 101, the redundant parts $y_{(1)}, y_{(2)}$ of the received symbol sequence are essentially passed through the RLU unit 101 to be the updated redundant parts $y_{u(1)}, y_{u(2)}$ for application to input terminals of component decoder $102_1$ and component decoder $102_2$, respectively. When invoked, RLU unit 101 generates a likelihood value $L(y_{(1)})$ for redundant part $y_{(1)}$ and an updated redundant part $y_{u(1)}$, as well as a likelihood value $L(y_{(2)})$ for redundant part $y_{(2)}$ and an updated redundant part $y_{u(2)}$.

Describing further now the structure of turbo code decoder 100 of FIG. 1A, extrinsic LLR $Le_2(d)$ taken from an output terminal of de-interleaver 106 is applied to an input terminal of component decoder $102_1$. During the first half-iteration, the component decoder $102_1$ generates an LLR $L_1(d)$ at a first output terminal and an LLR $Le_1(d)$ at a second output terminal.

In addition to receiving the systematic part $y_{(0)}$ of the received symbol sequence at its first input terminal, the interleaver 104 receives at its second input terminal the likelihood extrinsic value $Le_1(d)$ generated by component decoder $102_1$. The interleaver 104 uses the systematic part $y_{(0)}$ of the received symbol sequence to generate an interleaved systematic part $y_{(0)}'$ and an interleaved likelihood extrinsic value $Le_1'(d)$, both of which are applied to respective input terminals of component decoder $102_2$.

In the second half-iteration the component decoder $102_2$ generates values $L_2'(d)$ and $Le_2'(d)$ at respective output terminals, and applies both values to respective input terminals of de-interleaver 106. The de-interleaver 106 yields both a bit $L_2(d)$ and a bit $Le_2(d)$ at its respective output terminals. As mentioned previously, the bit $Le_2(d)$ is applied to component decoder $102_1$. The bit $L_2(d)$ is applied to hard bit decision unit 108, which produces the bit $\hat{d}$.

The decoding performed by turbo decoder 100 can, as an alternative mode of operation, be stopped after a first half of an interaction rather than waiting until completion of the second half of an interaction. In the half interaction stopping mode, the output $L_1(d)$ generated by component decoder $102_1$ is applied to hard bit decision unit 108 for producing $\hat{d}$.

In the embodiment of FIG. 1A the redundant likelihood update (RLU) unit 101 serves as a front end to the remainder of the turbo decoder. As hereinafter explained, the RLU unit 101 provides likelihood information with improved reliability for redundant parts $y_{(1)}$ and $y_{(2)}$ of a received symbol sequence $\bar{y}=\{y_{(0)}, y_{(1)}, y_{(2)}\}$. In other words, with the functionality of RLU unit 101 being placed in front of the remaining elements of turbo decoder 100, the updated redundant likelihood information $y_{u1}$ and $y_{u2}$ will be used when appropriate in the turbo decoder instead of $y_1$ and $y_2$.

Figure 2A:
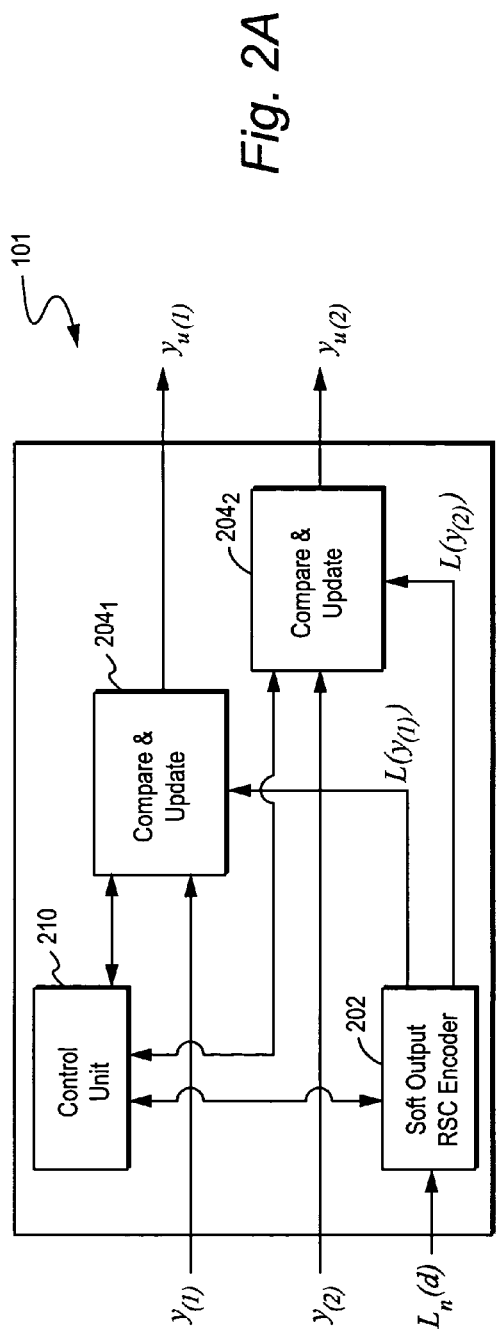
FIG. 2A and FIG. 2B are schematic views of different embodiments of example redundant likelihood update units for use in the turbo code decoders of FIG. 1A and FIG. 1B, respectively.

FIG. 2A shows an example redundant likelihood update (RLU) unit 101 of a type which is suitable for use in the turbo code decoder 100 of FIG. 1A. The example RLU unit 101 comprises a soft output recursive systematic convolutional (RSC) encoder 202 which uses the likelihood information for a systematic part of a received symbol sequence to generate likelihood information for a first redundant part of the received symbol sequence and to generate likelihood information for a second redundant part of the received symbol sequence. In particular, the soft output RSC encoder 202 of RLU unit 101 receives $L_1(d)$ which was generated by component decoder $102_1$ during the first half-iteration, and uses $L_1(d)$ to generate the likelihood $L(y_{(1)})$. Similarly, the soft output RSC encoder 202 of RLU unit 101 receives $L_2(d)$ which was generated by component decoder $102_2$ during the second half-iteration, and uses $L_2(d)$ to generate the likelihood $L(y_{(2)})$. As explained subsequently, the soft output RSC encoder 202 handles a posteriori log likelihood ratio (LLR) values.

In RLU unit 101 shown in FIG. 2A, soft output RSC encoder 202 with its input of systematic LLR re-generates likelihood information for the redundant parts (for the first redundant part and the second redundant part). The transfer function of soft output RSC encoder 202 corresponds with that of original binary RSC encoder, but the SISO-RSC encoder treats LLR values instead of binary digits. The soft output RSC encoder 202 can thus be realized by using log likelihood algebra instead of binary Boolean algebra.

The RLU unit 101 of FIG. 2A also comprises a first compare and update unit $204_1$ and a second compare and update unit $204_2$. The first compare and update unit $204_1$ compares the likelihood information $L(y_{(1)})$ for the first redundant part of the received symbol sequence with the original first redundant part $y_{(1)}$ of the received symbol sequence and obtains an updated likelihood value $y_{u(1)}$ for the first redundant part of the received symbol sequence. In similar manner, second compare and update unit $204_2$ compares the likelihood information $L(y_{(2)})$ for the second redundant part of the received symbol sequence with the original second redundant part $y_{(2)}$ of the received symbol sequence and obtains an updated likelihood value $y_{u(2)}$ for the second redundant part of the received symbol sequence. Either one or both of compares and update units 204, and $204_2$ may be in operation, but in either case control unit 210 acts as the master.

The operation of RLU unit 101, including the operation of soft output RSC encoder 202 and the compare and update units 204, is controlled and supervised by a timing and control unit 210. The timing and control unit 210 controls when the redundant information should be updated in the iterative decoding process, and supervises the correlation between the re-encoded sequence of the redundant LLR and the source sequence of the systematic LLR. That is, the timing and control unit 210 manages detection and updating of the error symbols, thereby enabling the redundant LLR value to improve the turbo decoding performance. Thus, it is important that the timing and control unit 210 operate the proposed update at an adequate timing. For example, an update at a very early stage of the decoding iterations could not work well, because the re-generated redundant LLR sequence is supposed to contain relatively more errors in lower SNR. On the contrary, if the redundant LLR sequence is re-generated at a considerably later stage, most of the errors might have been corrected through the decoding iterations. But this latter case is not expected to improve the error floor characteristics due to the strong correlation between the regenerated redundant and the source systematic sequence.

FIG. 3 shows an example soft output RSC encoder 202 for use in the example redundant likelihood update unit 101 of FIG. 2A. The example SISO-RSC encoder 202 of FIG. 3 is based on the following assumptions: the coding rate is R=⅓; RSC polynomials are 15, 13 in octal; and, the constraint length is K=4. In the soft output RSC encoder 202 of FIG. 3, the letter "D" denotes a shift register while the operator "+" denotes a log-likelihood addition. Thus, the example soft output RSC encoder 202 of FIG. 3 comprises four adders 302, 304, 306, and 308, and three shift registers 310, 312, and 314. Each of the four adders perform a log-likelihood addition operation.

The example soft output RSC encoder 202 of FIG. 3 may operated so that the soft output RSC encoder 302 receives $L_1(d)$ as $L_n(U)$, and outputs $L(y_{(1)})$ as $L(y_{(1)})$, and subsequently receives $L_2(d)$ as $L_n(U)$, and outputs $L(y_{(2)})$ as $L(y_{(2)})$. Alternatively, two separate and independent channels of the structure illustrated in FIG. 3 may be provided, one channel for the first redundant part and a second channel for the second redundant part.

In the soft output recursive systematic convolutional (RSC) encoder 202 of FIG. 3, a first shift register 310 receives an addition result from the first adder 302. A second adder 304 receives the likelihood information for a systematic part of a received symbol sequence as a first input to the second adder 304. A first shift register 310 receives an addition result from the first adder 302; a second shift register 312 receives shifted-out contents of the first shift register 310. The shifted-out contents of the second shift register 312 are also applied as a second input to the second adder 304. A third shift register 314 receives shifted-out contents of the second shift register 312. A third adder 306 receives the shifted-out contents of the second shift register 312 as a first input to the third adder 306 and receives shifted-out contents of the third shift register 314 as a second input to the third adder 306. An addition result of the third adder 306 is applied as a second input to the first adder 302. A fourth adder 308 receives an addition result from the second adder 304 as a first input to the fourth adder 308 and receives the shifted-out contents of the third shift register 314 as a second input to the fourth adder 308. An addition result of the fourth adder 308 is the likelihood value $L(y_{(1)})$ for one of the redundant parts of the received symbol sequence.

Thus, log-likelihood addition is performed by the adders of soft output RSC encoder 202. The log-likelihood addition is performed as an alternative to modulo-2 addition, modulo-2 addition being denoted by the operator $\oplus$. The log-likelihood addition is performed for two log-likelihood inputs "a" and "b" by the adders of soft output RSC encoder 202 is described by Expression (4).

$$L(a) \boxplus L(b) \equiv L(a \oplus b) \quad (4)$$
$$\approx (-1) \times \text{sign}[L(a)] \times \text{sign}[L(b)] \times \min[|L(a)|, |L(b)|].$$

With the approximations resulting from use of Expression (4), the amplitude of the operation result will be the minimum of the two inputs. If there are error symbols in the input sequence, those errors are spread into the coded sequence afterwards, due to the recursive encoding. Such spreading of errors is a risk when using the re-encoding method in the lower signal to noise ratio (SNR) conditions. However, the amplitude of the error symbols is statistically small and hence the amplitude of re-encoded LLR values are limited as minimum by the log-likelihood addition.

Figure 1B:
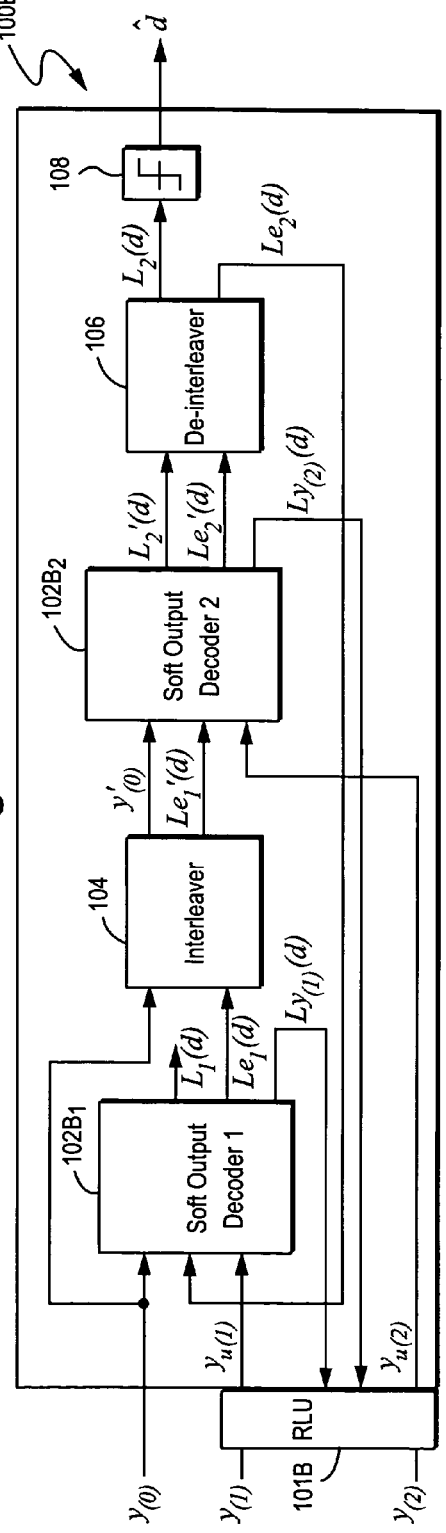

FIG. 1B shows another example embodiment turbo code decoder 100B which differs from the turbo code decoder 100 of FIG. 1A in that, e.g., the component decoder $102B_1$ and the component decoder $102B_2$ of turbo code decoder 100B have the additional capability of generating the likelihood information for the redundant parts of the received symbol sequence. In particular, the component decoder $102B_1$ generates likelihood information (shown as $Ly_{(1)}(d)$ in FIG. 1B) for a first redundant part of the received symbol sequence. Similarly, component decoder $102B_2$ generates likelihood information (shown as $Ly_{(2)}(d)$ in FIG. 1B) for a second redundant part of the received symbol sequence. Such being the case, the companion RLU unit 101B (see FIG. 2B) does not require a RSC encoder. Rather, the RLU unit 101B can have the likelihood information for the first redundant part (shown as $L(y_{(1)})$ in FIG. 2B) applied directly to the first compare and update unit $204_1$, and the likelihood information for the second redundant part (shown as $L(y_{(2)})$ in FIG. 2B) applied directly to the second compare and update unit $204_2$. In other respects, the structure and operation of the turbo decoder 100B of FIG. 1B and the RLU unit 101B of FIG. 2B are understood from the foregoing analogous description of the first embodiment.

Thus, for the turbo code decoder 100B of FIG. 1B, the component SISO decoders $102B_1$ and $102B_2$ provide the likelihood information for redundant part $L_{y1}(d)$ or $L_{y2}(d)$ as well as for systematic part $L_1(d)$ or $L_2(d)$. In this embodiment, component SISO decoders $102B_1$ and $102B_2$ render the SISO-RSC encoder 202 unnecessary. Therefore, as shown in FIG. 2B, the RLU unit 110B does not include a SISO-RSC encoder. The redundant likelihood update (RLU) unit 110B serves as a front end to the remainder of the turbo decoder, and supplies updated likelihood information for redundant part $y_{u1}$ and $y_{u2}$ and thereby provides improved reliability.

Figure 2B:
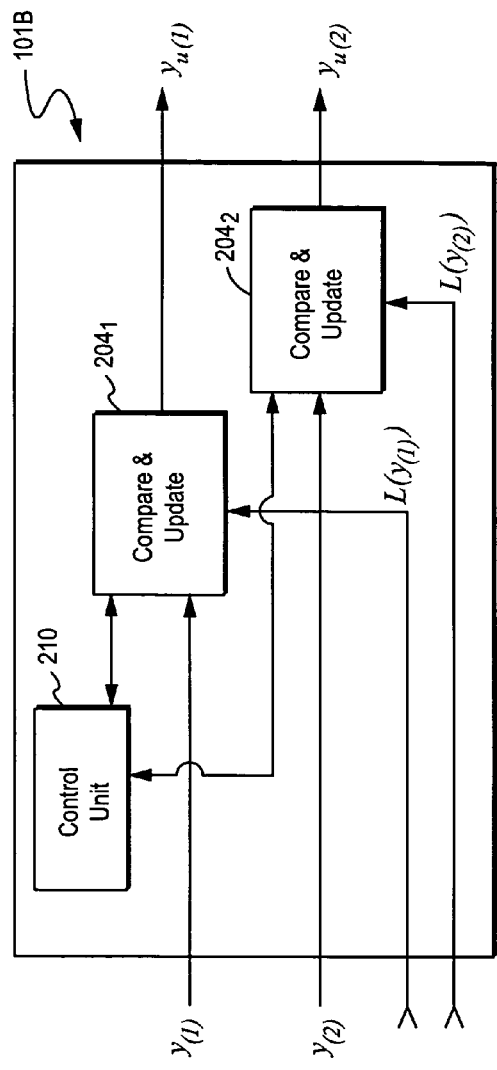
Figure 4:
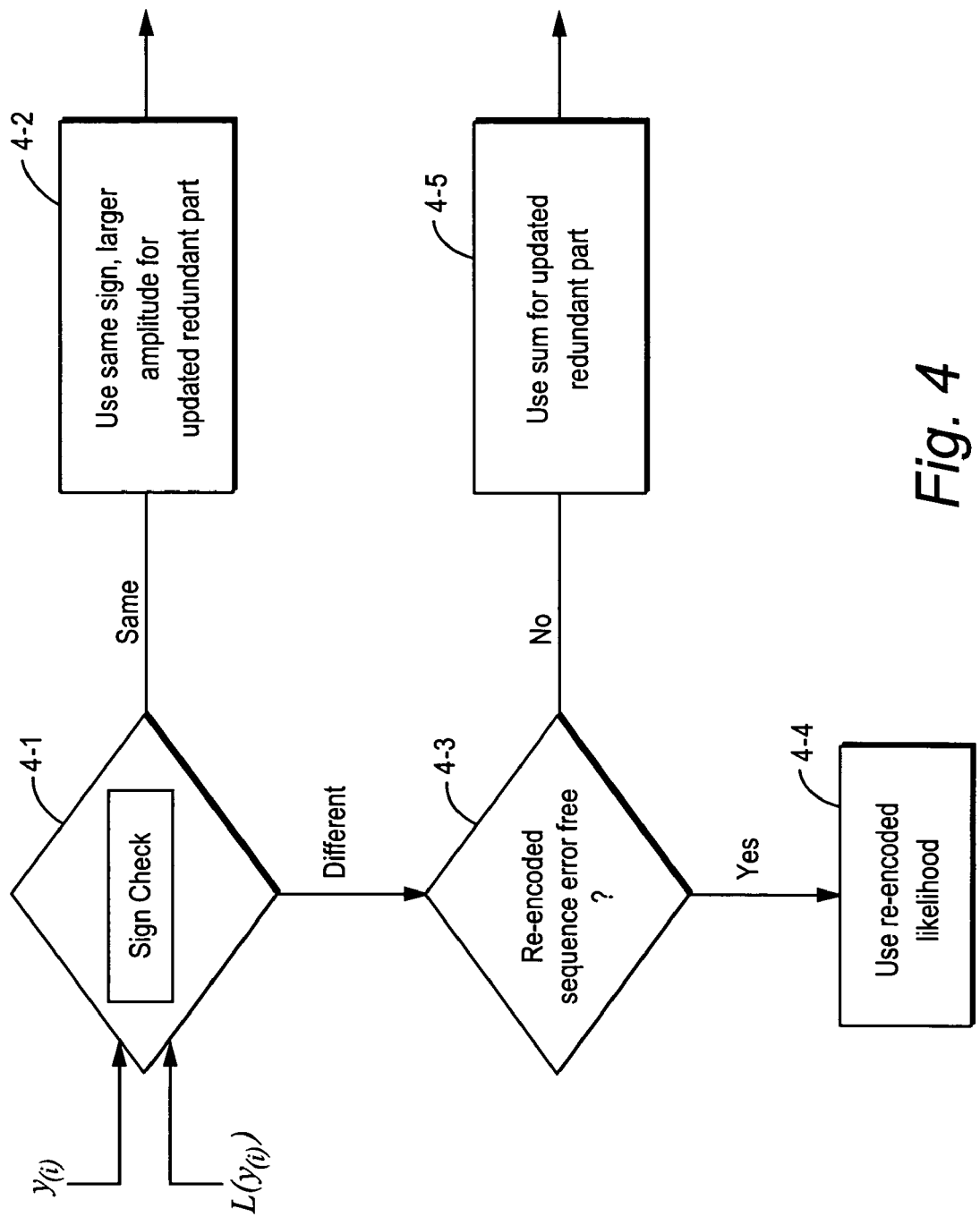
FIG. 4 is a flowchart showing example basic steps performed by a compare and update function of an example redundant likelihood update unit.

FIG. 4 is a flowchart showing example basic steps performed by a compare and update function of the example redundant likelihood update unit of FIG. 2A or the example redundant likelihood update unit of FIG. 2B. It should be understood that the general steps shown in FIG. 4 are representative of those performed by either first compare and update unit $204_1$ or the second compare and update unit $204_2$.

In updating a redundant part of the received symbol sequence, as step 4-1 a comparison is performed, on a bit by bit basis, between a sign of (1) the likelihood information $L(y_{(i)})$ for a redundant part (as obtained from soft output RSC encoder 202), and a sign of (2) a corresponding original redundant part $y_{(i)}$ of the received symbol sequence. If the signs for both $L(y_{(i)})$ and $y_{(i)}$ are the same, then as step 4-2 the updated redundant part for the $k^{th}$ symbol of the received symbol sequence, e.g., $y_{u(i)}$ is formed by using that same sign and by using, for the amplitude of the updated redundant part $y_{u(i)}$, the amplitude of the larger of $L(y_{(i)})$ and $y_{(i)}$. On the other hand, if the signs for $L(y_{(i)})$ and $y_{(i)}$ are different, at step 4-3 an optional check is made to ascertain whether an assumption has been made that the re-encoded sequence (e.g., $L(y_{(i)})$ as generated by soft output RSC encoder 202) is error free. If the check of step 4-3 reveals that the re-encoded sequence (e.g., $L(y_{(i)})$ as generated by soft output RSC encoder 202) is indeed assumed to be error free, then as step 4-4 the re-encoded sequence values (e.g., $L(y_{(i)})$) are utilized for the updated redundant part of the received symbol sequence, $y_{u(i)}$. If no such assumption has been made regarding the integrity of the re-encoded sequence $L(y_{(i)})$, or if optional step 4-3 is not performed, step 4-5 is executed. At step 4-5, a sum of $L(y_{(i)})$ and $y_{(i)}$ is utilized for the corresponding updated redundant part $y_{u(i)}$.

The compare and update units 204 thus first compare the redundant LLR sequence generated by re-encoding systematic LLR (by soft output RSC encoder 202) with the channel measurement for error detection. After the comparison, the compare and update units 204 update the original channel measurement values in response to the error detection results. Assuming that the LLR sequence input to the soft-RSC re-encoder 202 is error free in signs, the re-encoded sequence can be treated as the redundant likelihood information whose signs are error free. In such case, the signs of re-encoded sequence of redundant likelihood are compared with those of the channel measurement sequence for error detection. The comparisons are made for each bit in the sequence. Then the likelihood information is updated either at step 4-2 or step 4-5 according to the error detection results. In the case those signs are the same (determined at step 4-1), at step 4-2 the updated sequence will take either of larger amplitude value, namely for the $k^{th}$ symbol in the sequence, as indicated by Expression (5).

$$y_{ui}(k) = \begin{cases} y_i(k) & \text{for } |y_i(k)| > |L(y_i(k))| \\ L(y_i(k)) & \text{otherwise} \end{cases} \quad \text{Expression (5)}$$

Step 4-2 utilizes Expression (5) for two reasons: the matched signs should be recognized as probable, and the likelihood information should prevent their amplitude from getting too small by the effect of the SISO-RSC encoder 202.

If it is determined at step 4-1 that the signs are the different, either the channel redundant likelihood or the re-encoded likelihood is in error. If at step 4-3 it is guaranteed that the re-encoded sequence is error free, as step 4-4 the updated value takes the re-encoded likelihood. However, in reality there might be errors in the re-encoded sequence. Thus, if the updated value would take the re-encoded likelihood in such cases, the error symbols will become difficult to be corrected even though the decoding iteration goes because the re-encoded sequence is correlated with the source sequence which is the interim decoding result. That will cause the error floor characteristics. Therefore, the updated value should be neutral between the re-encoded likelihood and channel value as long as additional information about the reliability will not be obtained. Therefore, in one embodiment reflected in FIG. 4, as step 4-5 the updated sequence takes the sum of the LLR values of channel measurements and of SISO-RSC outputs assuming the reliability of them are equally treated, in accordance with Expression (6).

$$y_{ui}(k) = y_i(k) + L(y_i(k)) \quad \text{Expression (6)}$$

By using the rules of FIG. 4, the updated $y_{ui}(k)$ becomes more reliable than the original $y_i(k)$, whether k is an error or not. Consequently, the error correcting capability of the turbo code decoder is significantly improved.

Figure 5:
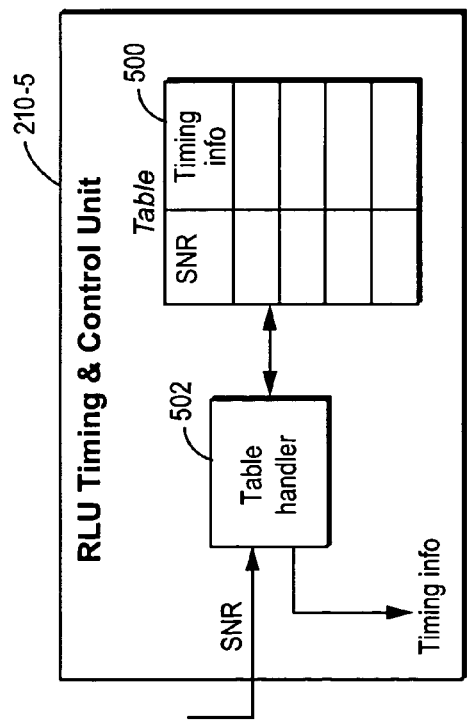
FIG. 5 is a schematic view of a first example embodiment timing and control unit for use in an example redundant likelihood update unit.

Several solutions are possible for implementing the RLU timing control, e.g., for implementing timing and control unit 210. One simple solution is based on the signal-to-noise ratio (SNR) of received signals. FIG. 5 illustrates an embodiment of timing and control unit 210-5 utilizing such a solution, wherein timing and control unit 210 comprises (or consults) a pre-defined timing information table 500.

When consulted via table handler logic 502, the table 500 supplies the optimal timings for the RLU update in accordance with the conditions of received SNR (the SNR conditions being used as an index to obtain the timing information for RLU unit 101). Once the information of SNR for received signals $y_{(0)}$, $y_{(1)}$, and $y_{(2)}$ has been obtained, the corresponding optimal timing information for the RLU update can be obtained by table handler 502 from table 500 in lookup fashion.

Figure 6:
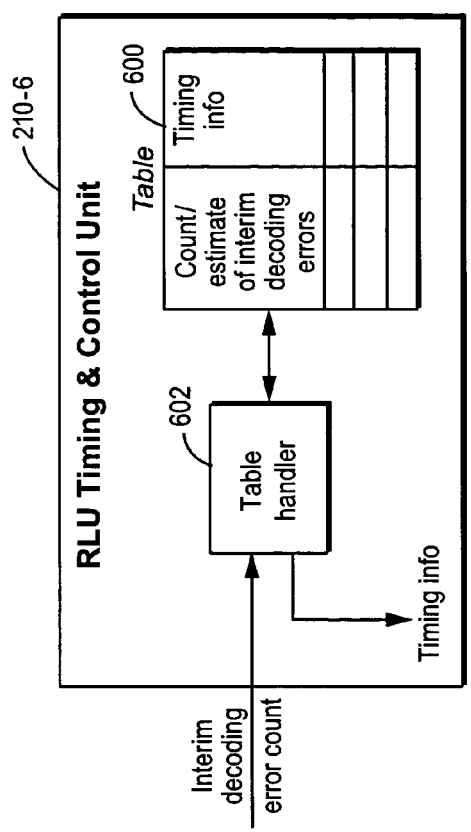
FIG. 6 is a schematic view of a second example embodiment timing and control unit for use in an example redundant likelihood update unit.

Another example embodiment for implementing a timing and control unit for RLU unit 101 is shown in FIG. 6. The timing and control unit 210-6 of FIG. 6 determines timing for operation of RLU unit 101 based on interim decoding error counts. In this embodiment, an estimate or count interim decoding errors in decoding iterations is applied to timing and control unit 210-6. The timing and control unit 210-6 comprises (or consults) a pre-defined timing information table 600. When consulted via table handler logic 602, the table 600 supplies the optimal timings for the RLU update in accordance with the condition (e.g., number or variation) of interim decoding errors. The decoder of this embodiment either employs or works in conjunction with means to estimate or count interim decoding errors in decoding iterations. According to the condition of interim decoding errors, the appropriate RLU timing information can be ascertained (e.g., from table 600). For example, a variation of error counts (decreasing or increasing) in time-series (decoding iterations) can be used as input.

Other configurations of timing and control unit 210 are also possible. For example, another embodiment of timing and control unit 210 can determine timing information based on both variation of error counts and received SNR measurement(s). Further, a method of determining timing for the RLU unit 101 using cross-entropy between outputs from two component decoders is also possible. Cross-entropy has previously been proposed as the stopping criterion of decoding iterations (see, M. Moher and T. A. Gulliver, "Cross-Entropy and Iterative Decoding," *IEEE Trans. On Information Theory*, vol. 44, no. 7, November 1998).

The RLU unit 101 and/or individual function blocks comprising RLU unit 101 may be implemented using individual hardware circuits, using software functioning in conjunction with a suitably programmed digital microprocessor or general purpose computer, using an application specific integrated circuit (ASIC), and/or using one or more digital signal processors (DSPs).

Since the turbo code decoder 100 with its RLU unit 101 is independent from the choice of the component decoder algorithms, there are no limitations for the selection of the component decoder, e.g., component decoder $102_1$ and component decoder $102_2$ can operate in accordance with any algorithm, e.g., SOVA. MAP, Log-MAP. Max-Log-MAP, etc.

Figure 7:
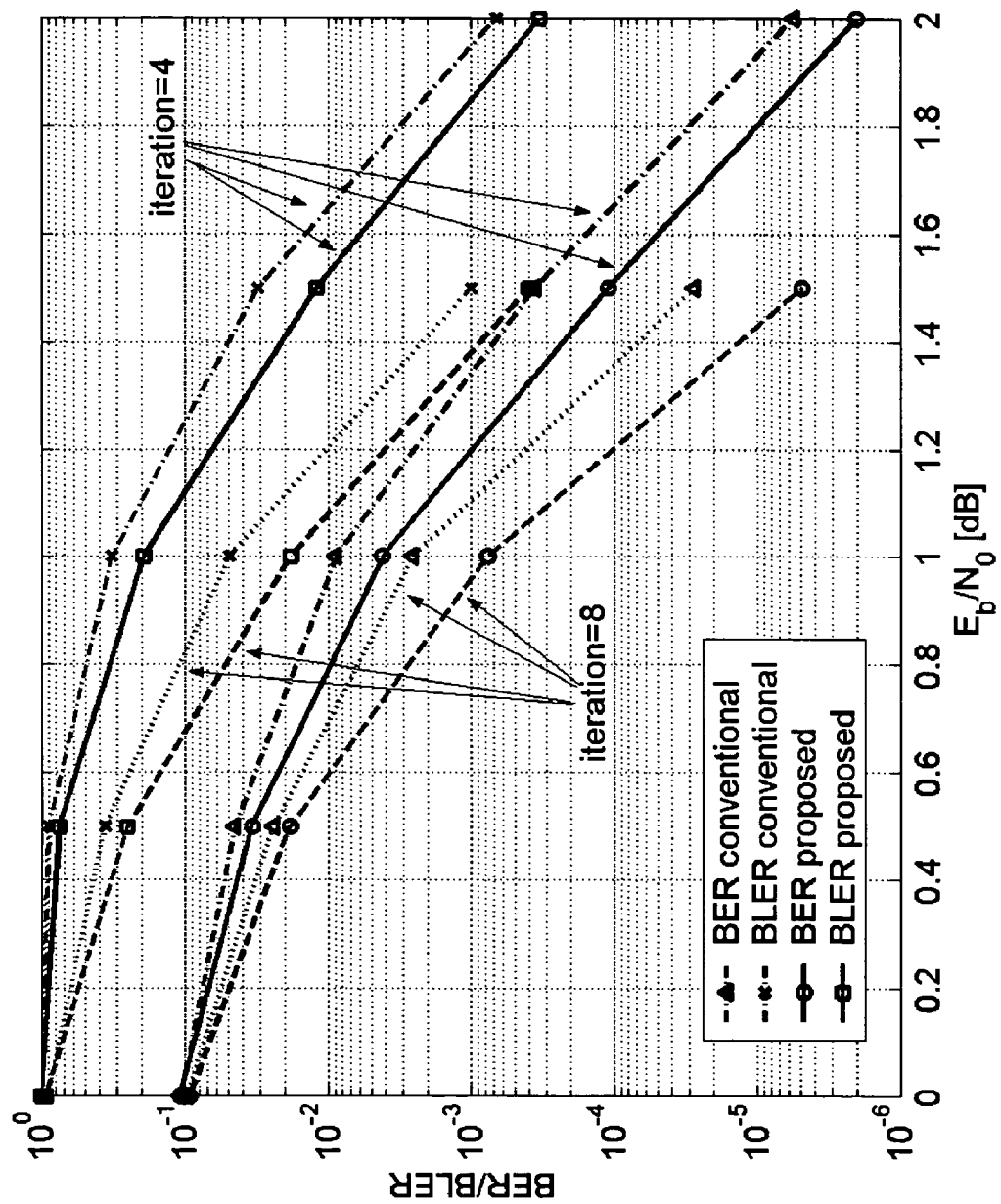
FIG. 7 is a graph showing error rate performance comparisons for the turbo code decoder of FIG. 1A.

One advantage which attends the turbo code decoders 100, 100B with their respective RLU units 101, 101B is improvements in bit error rate (BER) or block error rate (BLER) performance. FIG. 7 shows BER and BLER performance as a function of average SNR ($E_b/N_0$), where the conditions of the evaluation are assumed as listed in Table 1, and for an assumed Additive White Gaussian Noise (AWGN) channel model.

TABLE 1

Evaluation Parameters

| Items | Conditions |
|---|---|
| Coding Rate | R = 1/3 |
| RSC Polynomials | 15, 13 (octal), K = 4 [13] |
| Interleaver | Prime Interleaver [13] |
| Block Size | 656 bits (plus 3 tail bits) |
| Component Decoding Algorithm | BCJR (Log-MAP) [14] |
| Trellis Termination Strategy | Addition of 3 tail bits [13] |

Regarding the specific parameter set for the proposed decoding algorithm such as redundant likelihood update timing, the values optimized from the prior evaluations are used, i.e., RLU is carried out after the 1 st decoding iteration for $E_b/N_0$=1 dB and 2 dB, and after the 7 th iteration for 0 dB. It is seen that the proposed decoding method achieves improvements on the error rate performance, particularly in the regions of BER less than $10^{-2}$, and BLER less than $10^{-1}$. The results show that the proposed method of updating redundant likelihood information works effectively.

Figure 8:
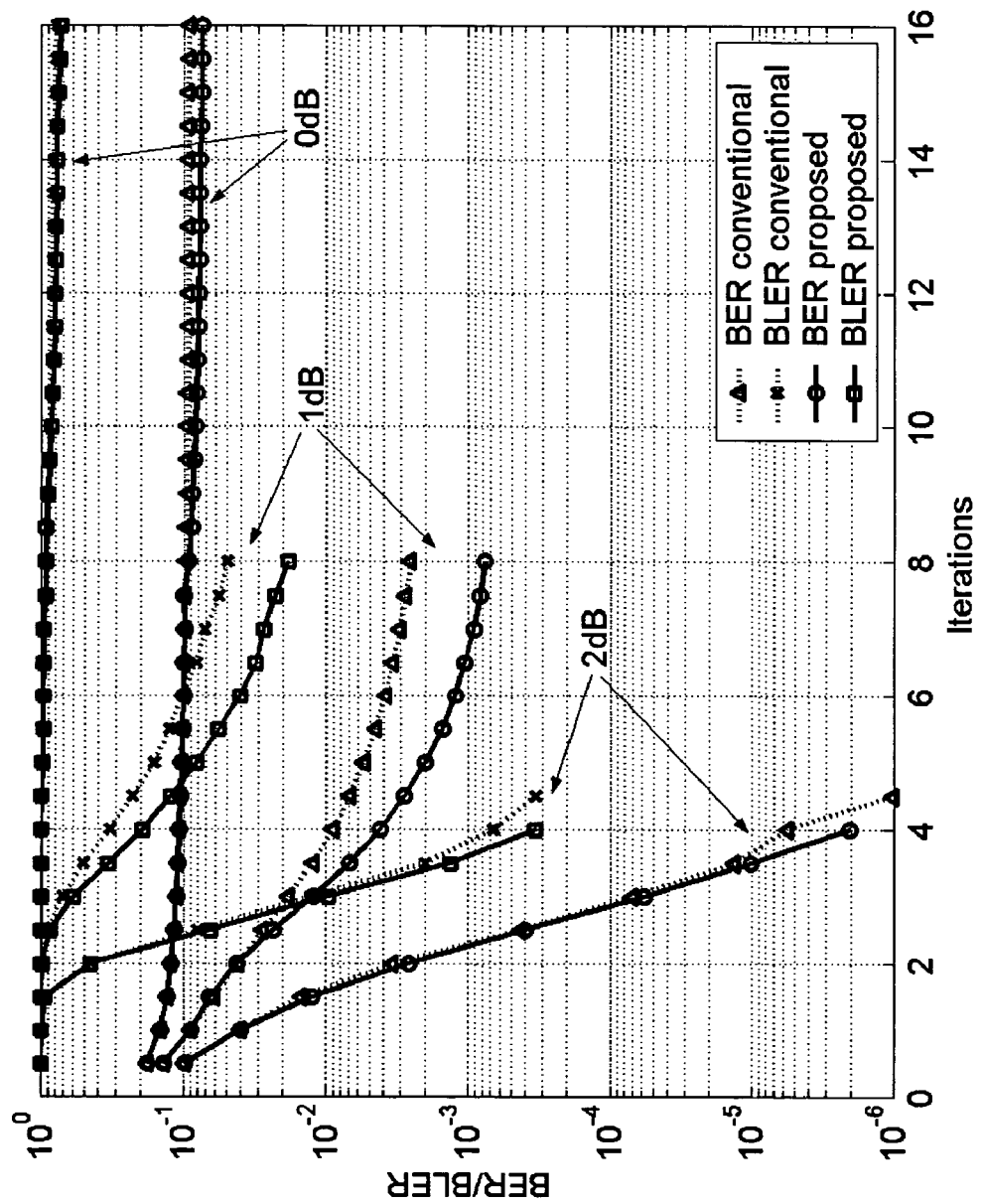
FIG. 8 is a graph showing error rate performance as a function of decoding iterations for the turbo code decoder of FIG. 1A.
Figure 10:
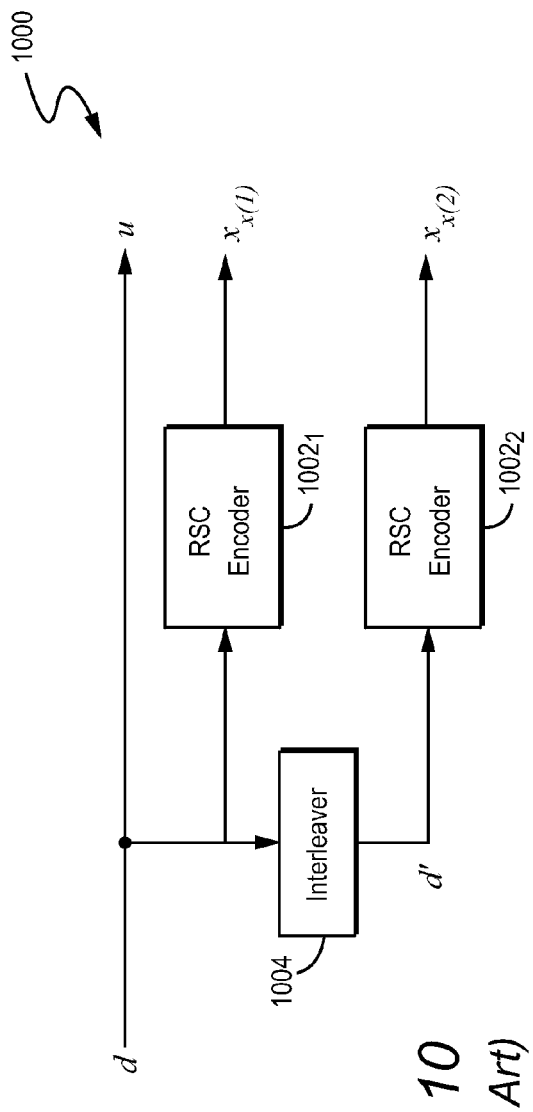
FIG. 10 is a schematic view of a conventional turbo code encoder.
Figure 11:
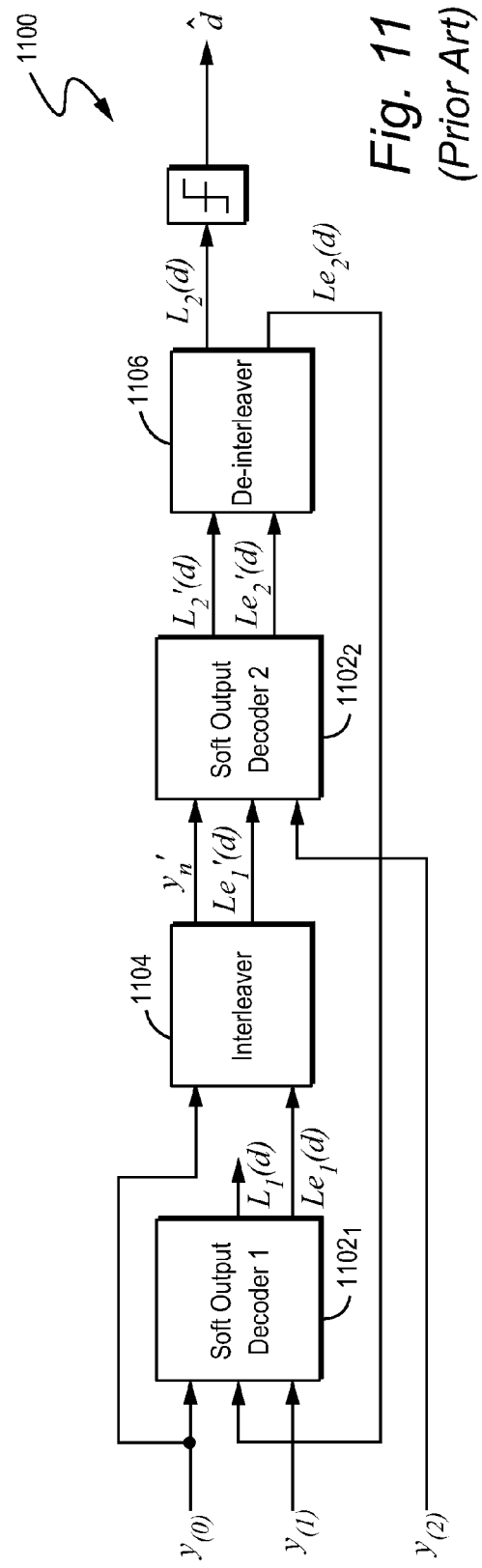
FIG. 11 is a schematic view of a conventional turbo code decoder.

As another advantage, the achievable BER/BLER can be improved by the turbo code decoders 100, 100B with their RLU units 101, 101B. In other words, the turbo code decoders with their RLU units can reduce decoding computations (iterations) and decoding processing time (delay). FIG. 8 shows the BER transition with increment of iteration numbers. In the case of average $E_b/N_0$=0 dB, BER for the proposed decoding method is slightly better than that for the conventional method after the 8 th iteration, because the redundant LLR update timing is the 7 th iteration. In the case of average $E_b/N_0$=1 dB, remarkable improvement can be seen on the error rate performance by the proposed decoding method with redundant likelihood update. Particularly, the BER/BLER curves for the proposed method drop quickly as number of iterations increases. This implies that the likelihood information of error bits potentially causing the error floor characteristics, is effectively corrected by the proposed method. In this condition, the proposed method improves the achievable BER/BLER limit, and reaches to the possible BER/BLER target at the earlier iterations than that of the conventional method. Since the channel condition of average $Eb/N_0$=2 dB seems good enough, no significant differences are observed on the error rates of the proposed and the conventional decoding methods. Only a little improvement with the proposed method is seen at the 4 th decoding iteration afterwards. From these results, it is found that there exist the regions where the noisy information on the redundant parts from the channel measurement might cause error floor characteristics. In that regions the proposed method updating the likelihood information for the redundant parts can improve error correcting performance of turbo codes.

The turbo code decoders herein described with their respective RLU units can be utilized in wide areas of applications that employ turbo codes. Nowadays, turbo codes have been in various practical use, such as channel coding scheme for cellular telecommunication systems, W-CDMA, cdmaOne, cdma2000, etc., wireless LAN, video transmission systems with MPEG-4, and etc. The equipment for all these systems could utilize the turbo decoder of the present invention.

Figure 9:
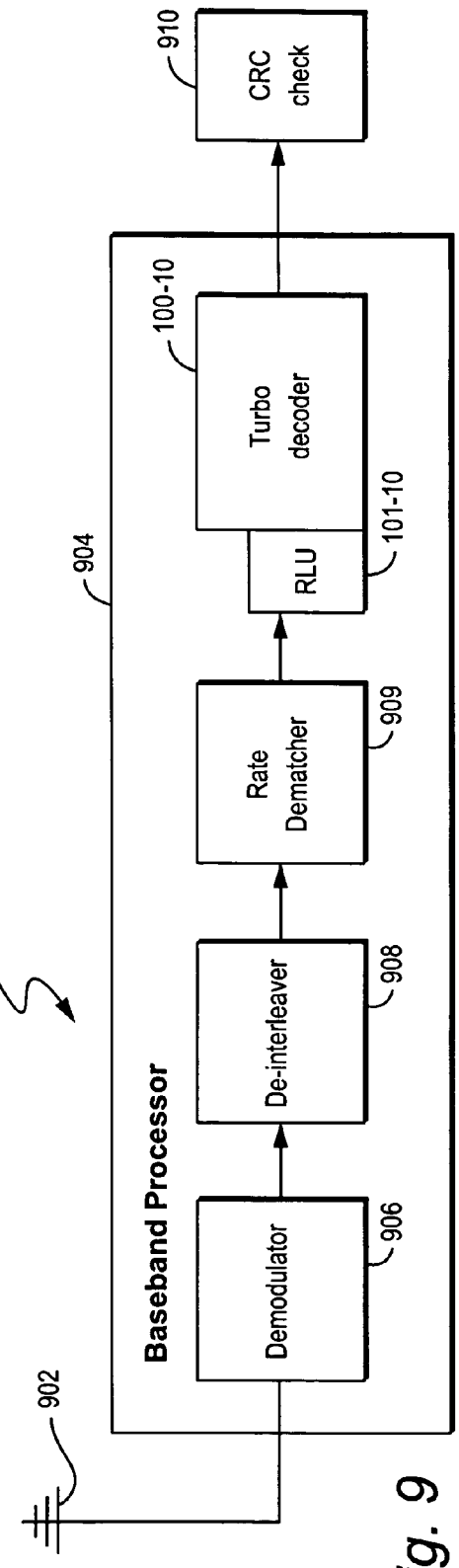
FIG. 9 is a schematic view of a wireless receiver that features a turbo code decoder such as the turbo decoder of FIG. 1A or the turbo decoder of FIG. 1B.

For example, FIG. 9 shows a wireless receiver 900 that features turbo code decoder 100-10. The wireless receiver 900 may be a receiver part of a network node such as a base station, or part of a mobile station such as a cellular phone, user equipment unit, or laptop (or other device) with mobile termination. The wireless receiver 900 has an antenna 902 and a base band signal processor/processing function 904. The base band processor 904 includes a demodulator 906 (e.g., rake receiver, which provides a demodulated base band signal); a de-interleaver 908 (optional, which de-interleaves the demodulated base band signal); rate de-matcher 909 (optional, which adjusts the number of demodulated bits being matched with that for the turbo decoder), and, turbo decoder 100-10. The decoded output from turbo code decoder 100-10 can optionally be input to a cyclic redundancy check (CRC) 910 for error detection.

As shown in FIG. 9, the turbo code decoder 100-10 comprises redundant likelihood update unit 101-10 which, in like manner as RLU unit 101 of FIG. 2A or the RLU unit 101B of FIG. 2B, uses the likelihood information for a systematic part of a received symbol sequence to generate likelihood information for redundant parts of the received symbol sequence, and uses the likelihood information for redundant parts of the received symbol sequence to update the redundant parts of the received symbol sequence for use by the decoder.

In a conventional turbo decoder, no likelihood information correlating to the redundant parts of the received symbol sequence is provided. By contrast, advantageously turbo code decoder 100 employs its RLU unit 101, featuring soft output RSC encoder 202, which re-generates LLR values for $y_i$ as $L(y_i)$, from its input $L_i(d)$, which input is known as the LLR valve for the systematic part. The SISO-RSC encoder 202 treats LLR values as soft-input and soft-output, but the functions of both SISO-RSC encoder and original binary RSC encoder correspond to each other. The LLR values for redundant parts generated by the SISO-RSC encoder 202 are compared with the sequence of original channel measurement for each symbol and updated.

The turbo decoder or decoding method described in example fashion above utilizes likelihood information for redundant parts of the received symbol sequence as inputs to the decoder, thereby providing improved reliability especially for redundant parts. Specifically, the redundant parts' likelihood information is updated to improve reliability.

Thus, in a first aspect of the invention, there is provided a turbo code decoder or decoding method which employs a Redundant Likelihood Update (RLU) unit or function in front end to a conventional turbo decoder. In the RLU, an interim likelihood information of the systematic part output from a component SISO decoder is re-encoded, thereby reflecting their likelihood information. Then the re-generated likelihood information for the redundant parts is compared with the redundant information already input to the decoder, and the updated values are generated accordingly. The updated value of redundant likelihood in the RLU can be more accurate and help the iterative decoders to improve their performance of coding gain and achievable BER limit.

In another aspect of the invention, there is provided a turbo code decoder or decoding method which employs a modified type of the component SISO decoders providing likelihood information for both systematic and redundant parts. In the modified SISO decoders, the likelihood information for redundant part is also updated through the decoding iterations.

Additionally in yet another aspect of the invention, there is provided a turbo code decoder or decoding method which employs another type of RLU unit or function in front end and the modified component SISO decoders described above. In this case, RLU controls the timing when the updated likelihood information for the redundant part is input to the component SISO decoders.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A turbo code decoder comprising a redundant likelihood update unit arranged for using likelihood information for a systematic part of a received symbol sequence for generating likelihood information for a redundant part of the received symbol sequence and for updating the redundant part by comparing, on a bit by bit basis, a sign of (1) the likelihood information for the redundant part of the received symbol sequence with a sign of (2) a corresponding original redundant part of the receiving symbol sequence.

2. The apparatus of claim 1, wherein the turbo code decoder comprises:
   a soft output decoder which provides likelihood information for a systematic part of a received symbol sequence.

3. The apparatus of claim 2, wherein the soft output decoder comprises:
   a first soft output decoder for generating likelihood information for a first redundant part of the received symbol sequence and a second soft output decoder which generates likelihood information for a second redundant part of the received symbol sequence; and
   wherein the redundant likelihood update unit comprises:
   a first compare and update unit arranged for comparing the likelihood information for the second redundant part of the received symbol sequence with an original second redundant part of the received symbol sequence and for obtaining an updated likelihood value for the second redundant part of the received symbol sequence.
   a second compare and update unit arranged for comparing the likelihood information for the second redundant part of the received symbol sequence with the original second redundant part of the received symbol sequence and for obtaining an updated likelihood value for the first redundant part of the received symbol sequence.

4. The apparatus of claim 1, wherein the redundant likelihood update unit comprises:
   a soft output recursive systematic convolutional (RSC) encoder arranged for using the likelihood information for a systematic part of a received symbol sequence to generate likelihood information for a first redundant part of the received symbol sequence and for generating likelihood information for a second redundant part of the received symbol sequence;
   a first compare and update unit arranged for comparing the likelihood information for the first redundant part of the received symbol sequence with the original first redundant part of the received symbol sequence and for obtaining an updated likelihood value for the first redundant part of the received symbol sequence;
   a second compare and update unit arranged for comparing the likelihood information for the second redundant part of the received symbol sequence with the original second redundant part of the received symbol sequence and for obtaining an updated likelihood value for the second redundant part of the received symbol sequence.

5. The apparatus of claim 4, wherein the soft output recursive systematic convolutional (RSC) encoder handles a posteriori log likelihood ratio (LLR) values.

6. The apparatus of claim 5, wherein the soft output recursive systematic convolutional (RSC) encoder comprises:
   a first adder arranged for receiving the likelihood information for a systematic part of a received symbol sequence as a first input to the first adder;
   a second adder arranged for receiving the likelihood information for a systematic part of a received symbol sequence as a first input to the second adder;
   a first shift register arranged for receiving an addition result from the first adder;
   a second shift register arranged for receiving shifted-out contents of the first shift register, the shifted-out contents of the second shift register also being applied as a second input to the second adder;
   a third shift register arranged for receiving shifted-out contents of the second shift register;
   a third adder arranged for receiving the shifted-out contents of the second shift register as a first input to the third adder and arranged for receiving shifted-out contents of the third shift register as a second input to the third adder, an addition result of the third adder being applied as a second input to the first adder;
   a fourth adder arranged for receiving an addition result from the second adder as a first input to the fourth adder and arranged for receiving the shifted-out contents of the third shift register as a second input to the fourth adder, an addition result of the fourth adder being a likelihood value for one of the redundant parts of the received symbol sequence;
   wherein each of the first adder, the second adder, the third adder, and the fourth adder are arranged for performing a log-likelihood addition operation.

7. The apparatus of claim 6, wherein the log-likelihood addition operation performs the following operation with respect to a first log likelihood input L(a) and a second log likelihood input L(b):

$$L(a) \; L(b) \equiv L(a \oplus b)$$
$$\approx (-1) \times \text{sign}[L(a)] \times \text{sign}[L(b)] \times \min[|L(a)|, |L(b)|].$$

8. The apparatus of claim 1, wherein in updating a redundant part of the received symbol sequence the redundant likelihood update unit is arranged for performing the further steps of:
   if the signs for (1) and (2) are the same, for an amplitude of the corresponding updated redundant part for the $k^{th}$ symbol of the received symbol sequence using an amplitude of a larger of (1) and (2);
   if the signs for (1) and (2) are different, using a sum of (1) and (2) for the corresponding updated redundant part for the $k^{th}$ symbol of the received symbol sequence.

9. The apparatus of claim 1, wherein the redundant likelihood update unit further comprises a timing and control unit arranged for determining timing for operation of the redundant likelihood update unit based on a signal-to-noise ratio (SNR) of received signals.

10. The apparatus of claim 1, wherein the redundant likelihood update unit further comprises a timing and control unit arranged for determining timing for operation of the redundant likelihood update unit based on interim decoding error counts.

11. A wireless radio frequency receiver comprising:
   an antenna;
   a base band signal processor comprising:
      a demodulator which provides a demodulated base band signal;
      a turbo decoder arranged for receiving the demodulated base band signal which is arranged for using likelihood information for redundant parts of a received symbol sequence to update the redundant parts of the received symbol sequence for use by the decoder by comparing, on a bit by bit basis, a sign of (1) the likelihood information for the redundant part of the received symbol sequence with a sign of (2) a corresponding original redundant part of the received symbol sequence.

12. The apparatus of claim 11, wherein the turbo code decoder comprises:
   a soft output decoder arranged for providing likelihood information for a systematic part of the received symbol sequences; and
   a redundant likelihood update unit arranged for using the likelihood information for the systematic redundant parts of the received symbol sequence for generating the likelihood information for the redundant parts of the received symbol sequence.

13. The apparatus of claim 11, wherein the redundant likelihood update unit comprises:
   a first soft output decoder arranged for generating likelihood information for a first redundant part of the received symbol sequence and a second soft output decoder arranged for generating likelihood information for a second redundant part of the received symbol sequence;
   a first compare and update unit arranged for comparing the likelihood information for a first redundant part of the received symbol sequence with an original first redundant part of the received symbol sequence and arranged for obtaining an updated likelihood value for the first redundant part of the received symbol sequence;
   a second compare and update unit arranged for comparing the likelihood information for a second redundant part of the received symbol sequence with an original second redundant part of the received symbol sequence and for obtaining an updated likelihood value for the second redundant part of the received symbol sequence.

14. The apparatus of claim 11, wherein the turbo code decoder provides likelihood information for a systematic part of a received symbol sequence and further comprises a redundant likelihood update unit arranged for using the likelihood information for the systematic part of a received symbol sequence for generating the likelihood information for the redundant parts of the received symbol sequence.

15. The apparatus of claim 11, wherein the redundant likelihood update unit comprises:
   a soft output recursive systematic convolutional (RSC) encoder arranged for using the likelihood information for a systematic part of a received symbol sequence for generating likelihood information for a first redundant part of the received symbol sequence and for generating comparing likelihood information for a second redundant part of the received symbol sequence;

a first compare and update unit arranged for comparing the likelihood information for the first redundant part of the received symbol sequence with the original first redundant part of the received symbol sequence and for obtaining an updated likelihood value for the first redundant part of the received symbol sequence;

a second compare and update unit arranged for comparing the likelihood information for the second redundant part of the received symbol sequence with the original second redundant part of the received symbol sequence and for obtaining an updated likelihood value for the second redundant part of the received symbol sequence.

16. The apparatus of claim 15, wherein the soft output recursive systematic convolutional (RSC) encoder handles a posteriori log likelihood ratio (LLR) values.

17. The apparatus of claim 16, wherein the soft output recursive systematic convolutional (RSC) encoder comprises:

a first adder arranged for receiving the likelihood information for a systematic part of a received symbol sequence as a first input to the first adder;

a second adder arranged for receiving the likelihood information for a systematic part of a received symbol sequence as a first input to the second adder;

a first shift register arranged for receiving an addition result from the first adder;

a second shift register arranged for receiving shifted-out contents of the first shift register, the shifted-out contents of the second shift register also being applied as a second input to the second adder;

a third shift register arranged for receiving shifted-out contents of the second shift register, a third adder arranged for receiving the shifted-out contents of the second shift register as a first input to the third adder and arranged for receiving shifted-out contents of the third shift register as a second input to the third adder, an addition result of the third adder being applied as a second input to the first adder;

a fourth adder arranged for receiving the an addition result from the second adder as a first input to the fourth adder and arranged for receiving the shifted-out contents of the third shift register as a second input to the fourth adder, an addition result of the fourth adder being a likelihood value for one of the redundant parts of the received symbol sequence;

wherein each of the first adder, the second adder, the third adder, and the fourth adder are arranged for performing a log-likelihood addition operation.

18. The apparatus of claim 17, wherein the log-likelihood addition operation performs the following operation with respect to a first log likelihood input L(a) and a second log likelihood input L(b):

$$L(a)\ L(b) \equiv L(a \oplus b)$$

$$\approx (-1) \times \text{sign}[L(a)] \times \text{sign}[L(b)] \times \min[|L(a)|, |L(b)|].$$

19. The apparatus of claim 11, wherein in updating a redundant part of the received symbol sequence the redundant likelihood update unit is arranged for performing the further steps of:

if the signs for (1) and (2) are the same, for an amplitude of the corresponding updated redundant part for the $k^{th}$ symbol of the received symbol sequence using an amplitude of a larger of (1) and (2);

if the signs for (1) and (2) are different, using a sum of (1) and (2) for the corresponding updated redundant part for the $k^{th}$ symbol of the received symbol sequence.

20. The apparatus of claim 11, wherein the redundant likelihood update unit further comprises a timing and control unit arranged for determining timing for operation of the redundant likelihood update unit based on a signal-to-noise ratio (SNR) of received signals.

21. The apparatus of claim 11, wherein the redundant likelihood update unit further comprises a timing and control unit arranged for determining timing for operation of the redundant likelihood update unit based on interim decoding error counts.

22. A method of operating a turbo code decoder comprising:

generating likelihood information for a systematic part of a received symbol sequence;

using the likelihood information for a systematic part of a received symbol sequence to generating likelihood information for redundant parts of the received symbol sequence; and, using the likelihood information for redundant parts of the received symbol sequence to update the redundant parts of the received symbol sequence for use by the decoder by comparing on a bit by bit basis, a sign of (1) the likelihood information for the redundant part of the received symbol sequence with a sign of (2) a corresponding original redundant part of the received symbol sequence.

23. The method of claim 22, further comprising:

using at least one soft output decoder to provide (1) likelihood information for a systematic part of the received symbol sequence; (2) likelihood information for a first redundant part of the received symbol sequence; and (3) likelihood information for a second redundant part of the received symbol sequence;

comparing the likelihood information for the first redundant part of the received symbol sequence with the original first redundant part of the received symbol sequence and obtaining an updated likelihood value for the first redundant part of the received symbol sequence;

comparing the likelihood information for the second redundant part of the received symbol sequence with the original second redundant part of the received symbol sequence and obtaining an updated likelihood value for the second redundant part of the received symbol sequence.

24. The method of claim 22, further comprising:

using a soft output recursive systematic convolutional (RSC) encoder to generate likelihood information for a first redundant part of the received symbol sequence and to generating likelihood information for a second redundant part of the received symbol sequence;

comparing the likelihood information for the first redundant part of the received symbol sequence with the original first redundant part of the received symbol sequence and obtaining an updated likelihood value for the first redundant part of the received symbol sequence;

comparing the likelihood information for the second redundant part of the received symbol sequence with the original second redundant part of the received symbol sequence and obtaining an updated likelihood value for the second redundant part of the received symbol sequence.

25. The method of claim 24, comprising using the soft output recursive systematic convolutional (RSC) encoder for handling a posteriori log likelihood ratio (LLR) values.

26. The method of claim 22, wherein in updating a redundant part of the received symbol sequence the method further comprises:

if the signs for (1) and (2) are the same, for an amplitude of the corresponding updated redundant part for the $k^{th}$ symbol of the received symbol sequence using an amplitude of a larger of (1) and (2);

if the signs for (1) and (2) are different, using a sum of (1) and (2) for the corresponding updated redundant part for the $k^{th}$ symbol of the received symbol sequence.

27. The method of claim 22, further comprising determining timing information for generating likelihood information for redundant parts based on a signal-to-noise ratio (SNR) of received signals.

28. The method of claim 22, further comprising determining timing information for generating likelihood information for redundant parts based on interim decoding error counts.

* * * * *

UNITED STATES PATENT AND TRADEMARK OFFICE
CERTIFICATE OF CORRECTION

PATENT NO.       : 7,168,030 B2
APPLICATION NO. : 10/686774
DATED             : January 23, 2007
INVENTOR(S)       : Ariyoshi It is certified that error appears in the above-identified patent and that said Letters Patent is hereby corrected as shown below:

Column 2, Line 15, delete "$Y_{(2)}$" and insert -- $y_{(2)}$ --, therefor.

Column 6, Line 65, delete "$\bar{y}=\{_{(o)}, y_{(1)}, y_{(2)}]$" and insert -- $\bar{y} = \{y_{(0)}, y_{(1)}, y_{(2)}\}$ --, therefor.

Column 8, Line 17, delete "302" and insert -- 202 --, therefor.

Column 14, Line 34, in Claim 3, delete "second" and insert -- first --, therefor.

Column 14, Line 36, in Claim 3, delete "second" and insert -- first --, therefor.

Column 14, Line 38, in Claim 3, delete "second" and insert -- first --, therefor.

Column 14, Line 39, in Claim 3, delete "sequence." and insert -- sequence: --, therefor.

Column 14, Line 45, in Claim 3, delete "first" and insert -- second --, therefor.

Column 15, Line 45, in Claim 7, delete "$L(a) L(b) \equiv L(a \oplus b)$" and insert -- $L(a) \boxplus L(b) \equiv L(a \oplus b)$ --, therefor.

Column 16, Line 23, in Claim 12, delete "sequences" and insert -- sequence --, therefor.

Column 16, Line 66, in Claim 15, delete "comparing" before "likelihood".

Column 17, Line 56, in Claim 18, delete "$L(a) L(b) \equiv L(a \oplus b)$" and insert -- $L(a) \boxplus L(b) \equiv L(a \oplus b)$ --, therefor.

Column 18, Line 22, in Claim 22, delete "generating" and insert -- generate --, therefor.

UNITED STATES PATENT AND TRADEMARK OFFICE
CERTIFICATE OF CORRECTION

PATENT NO. : 7,168,030 B2
APPLICATION NO. : 10/686774
DATED : January 23, 2007
INVENTOR(S) : Ariyoshi It is certified that error appears in the above-identified patent and that said Letters Patent is hereby corrected as shown below:

Column 18, Line 57, in Claim 24, delete "generating" and insert -- generate --, therefor.

Signed and Sealed this

First Day of April, 2008

JON W. DUDAS
*Director of the United States Patent and Trademark Office*